United States Patent
Schwarzl et al.

(10) Patent No.: US 7,323,821 B2
(45) Date of Patent: Jan. 29, 2008

(54) DEVICE FOR GENERATING AND/OR INFLUENCING ELECTROMAGNETIC RADIATION FROM A PLASMA

(75) Inventors: Siegfried Schwarzl, Neubiberg (DE); Stefan Wurm, Austin, TX (US)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 11/290,620

(22) Filed: Nov. 30, 2005

(65) Prior Publication Data

US 2006/0132046 A1    Jun. 22, 2006

Related U.S. Application Data

(63) Continuation of application No. PCT/DE2004/001132, filed on May 27, 2004.

(30) Foreign Application Priority Data

May 30, 2003 (DE) ................. 103 25 151

(51) Int. Cl.
*H01J 7/24* (2006.01)
(52) U.S. Cl. ............... 315/111.41; 315/111.01; 315/111.21; 250/492.2; 250/396 ML; 250/396 R
(58) Field of Classification Search ......... 315/111.21, 315/111.41, 111.51; 250/396 R, 396 ML, 250/398, 427, 492.1, 492.2, 492.21, 492.22; 378/34–35
See application file for complete search history.

(56) References Cited

U.S. PATENT DOCUMENTS

| | | | |
|---|---|---|---|
| 3,655,508 A | 4/1972 | Hirsch | |
| 4,028,547 A * | 6/1977 | Eisenberger | 378/34 |
| 4,152,625 A | 5/1979 | Conrad | |
| 4,553,256 A | 11/1985 | Moses | |
| 4,635,282 A | 1/1987 | Okada et al. | |
| 4,746,799 A | 5/1988 | McMillan | |
| 4,771,447 A | 9/1988 | Saitoh et al. | |
| 4,837,794 A | 6/1989 | Riordan et al. | |
| 5,350,924 A * | 9/1994 | Stengl et al. | 250/492.2 |

(Continued)

FOREIGN PATENT DOCUMENTS

DE    1 929 240    12/1969

(Continued)

OTHER PUBLICATIONS

Banine, V., et al., "Extreme ultraviolet sources for lithography applications", Emerging Lithographic Technologies V, Proceedings of SPIE, 2001, pp. 203-214, vol. 4343, no date.

(Continued)

*Primary Examiner*—Haissa Philogene
*Assistant Examiner*—Tung X Le
(74) *Attorney, Agent, or Firm*—Slater & Matsil, L.L.P.

(57) ABSTRACT

A device generates and/or influences electromagnetic radiation from a plasma, for the lithographic production of semiconductor elements. For example, the device generates and/or reflects EUV-radiation for EUV-lithography. In a first example, a magnetic means (10) generates at least one inhomogeneous magnetic field (11) and is provided as means for the targeted screening of at least one surface of the device (1; 5; 12) and/or another component (5; 12) from the charge carriers in the plasma (3).

20 Claims, 6 Drawing Sheets

U.S. PATENT DOCUMENTS

| | | |
|---|---|---|
| 5,680,429 A | 10/1997 | Hirose et al. |
| 6,084,356 A * | 7/2000 | Seki et al. ............... 315/111.41 |
| 6,377,651 B1 | 4/2002 | Richardson et al. |
| 6,795,462 B1 | 9/2004 | Christiansen et al. |
| 6,870,320 B2 * | 3/2005 | Ratzinger et al. ....... 315/111.01 |
| 6,873,113 B2 * | 3/2005 | Dandl et al. ............ 315/111.71 |
| 6,876,154 B2 * | 4/2005 | Appleyard ............. 315/111.21 |
| 2002/0163313 A1 | 11/2002 | Ness et al. |
| 2003/0006383 A1 * | 1/2003 | Melnychuk et al. .... 250/504 R |
| 2003/0006708 A1 | 1/2003 | Leung et al. |
| 2003/0209676 A1 * | 11/2003 | Loschner et al. ........ 250/492.2 |
| 2003/0219056 A1 | 11/2003 | Yager et al. |
| 2003/0234617 A1 * | 12/2003 | Monkhorst et al. ..... 315/111.41 |
| 2004/0056207 A1 * | 3/2004 | Petrov et al. ........ 250/396 ML |
| 2004/0071267 A1 * | 4/2004 | Jacob et al. ................. 378/119 |
| 2004/0108473 A1 | 6/2004 | Melnychuk et al. |
| 2004/0160155 A1 | 8/2004 | Partlo et al. |
| 2004/0212312 A1 * | 10/2004 | Chistyakov ............ 315/111.21 |
| 2005/0155624 A1 | 7/2005 | Lee et al. |
| 2005/0253092 A1 * | 11/2005 | Zukavishvili et al. .... 250/492.2 |
| 2006/0132046 A1 * | 6/2006 | Schwarzl et al. ....... 315/111.41 |

FOREIGN PATENT DOCUMENTS

| | | |
|---|---|---|
| DE | 36 88 946 T2 | 11/1986 |
| DE | 199 30 755 A1 | 1/2001 |
| JP | 2001217096 A | 8/2001 |
| WO | WO 03/087867 A2 | 10/2003 |

OTHER PUBLICATIONS

Lebert, R., et al., "Comparison of Different Source Concepts for EUVL", Emerging Lithographic Technologies V, Proceedings of SPIE, 2001, pp. 215-225, vol. 4343, no date.

Moyer, R. H., et al. "Laser-Produced Plasma (LPP) Scale-up and Commercialization", Emerging Lithographic Technologies V, Proceedings of SPIE, 2001, pp. 249-254, vol. 4343, no date.

Pinches, S. D., "Nonlinear Interaction of Fast Particles with Alfvén Waves in Tokamaks", http://www.rzg.mpg.de/~slp/thesis, 5 pages, Nov. 1996.

Tichenor, D. A., et al., "System Integration and Performance of the EUV Engineering Test Stand", Emerging Lithographic Technologies V, Proceedings of SPIE, 2001, pp. 19-37, vol. 4343, no date.

* cited by examiner

DEVICE FOR GENERATING AND/OR INFLUENCING ELECTROMAGNETIC RADIATION FROM A PLASMA

This application is a continuation of co-pending International Application No. PCT/DE2004/001132, filed May 27, 2004, which designated the United States and was not published in English, which International Application is based on German Application No. 103 25 151.0, filed May 30, 2003, both of which applications are incorporated herein by reference.

TECHNICAL FIELD

The invention relates generally to semiconductor fabrication, and more particularly to an apparatus and method for lithographic fabrication.

BACKGROUND

In semiconductor technology it is necessary to produce ever smaller structures on a substrate. So-called extreme ultraviolet (EUV) lithography technology with wavelengths in the soft X-ray range (10-15 nm) is currently being developed for the lithographic patterning of dimensions below 50 nm. One insulation appertaining to this technology is known, e.g., from the article by D. A. Tichenor et al. "System Integration and Performance of the EUV Engineering Test Stand", Emerging Lithographic Technologies V, Proceedings of SPIE Vol. 4343, pp. 19 to 37, (2001). This article describes the generation of the EUV radiation by means of a xenon plasma.

In the apparatus configuration an influencing device, use is made for example, of multilayer reflection mirrors for illuminator, imaging optical system and mask, in order to capture the emitted radiation. Said multilayer reflection mirrors generally comprise 40 to 50 Mo/Si double layers having a thickness of 6.8 nm in each case, corresponding to half the wavelength of the EUV radiation used.

"Laser Produced Plasma" (LPP) sources and "Discharge Produced Plasma" (DPP) sources are known as radiation sources for generating the plasma (see e.g. Banine and Moors, "Extreme Ultraviolet Sources for Lithography Applications", Emerging Lithographic Technologies V, Proceedings of SPIE Vol. 4343, pp. 203 to 214, (2001); Lebert et al. "Comparison of Different Source Concepts for EUVL", Emerging Lithographic Technologies V, Proceedings of SPIE Vol. 4343, pp. 215 to 225, (2001) and Moyer et al. "Laser Produced Plasma (LPP) Scale-up and Commercialization", Emerging Lithographic Technologies V, Proceedings of SPIE Vol. 4343, pp. 249 to 254, (2001)).

In an evacuated vacuum chamber of the illuminator (also called condenser) that contains the EUV source and condenser mirrors, a substance (usually xenon) is highly ionized by means of a laser pulse (typically Nd:YAG) in the case of an LPP source or by means of an electrical discharge in the case of a DPP source. The plasma is restricted to the laser focal range and emits light in the desired EUV range. The multilayer mirrors of the illuminator, in particular the first condenser mirror, are exposed to bombardment by multiply charged ions.

This gives rise to the problem that, as a result of sputtering and implantation effects, and also as a result of electron and ion assisted deposition and oxidation processes, particularly the mirror devices and the gas outlet nozzles of the plasma sources are damaged considerably during operation of the plasma sources and their service life is limited. Average value and homogeneity of the reflectivity of the mirrors thereby decrease rapidly and the roughness increases. The consequence is high costs owing to the required exchange of the multilayer mirrors (in particular of the first condenser mirror) and of the source components (e.g. nozzles).

Hereto, this problem has been counteracted only by selecting suitable inert materials for the device. The plasma-induced depositions of carbon-containing layers can be compensated for by metered oxidizing additions of, e.g. water or alcohols. In this case, by way of example, the multilayer mirrors must not be damaged by excessive oxidation.

The problem of the known solutions is that the ion bombardment has not been counteracted hereto. The problem thus remains and the device continues to be exposed to ion bombardment and wear.

SUMMARY OF THE INVENTION

In one aspect, the invention counteracts the ion bombardment of the device and/or other components itself, that is to say of combating the cause. The intention is thereby to increase the service life of the device and/or of components and to lower the operating costs.

A first embodiment provides a device for generation of and/or influencing electromagnetic radiation from a plasma for the lithographic fabrication of semiconductor components. As an example, the invention can be used for the generation and/or reflection of EUV radiation for EUV lithography. This first embodiment includes a magnetic means for the generation of at least one inhomogeneous magnetic field as means for the targeted shielding of at least one surface of the device and/or another component from charge carriers of the plasma.

The solution according to the invention is distinguished by the fact that the device for generation of and/or influencing electromagnetic radiation from a plasma for the lithographic fabrication of semiconductor components, in particular for the generation and/or reflection of EUV radiation for EUV lithography, has a magnetic means for the generation of at least one inhomogeneous magnetic field as means for the targeted shielding of at least one surface of the device and/or another component from charge carriers in the plasma.

By means of the inhomogeneous magnetic field, the charge carriers of the plasma are forced on helical paths around the magnetic field lines. A suitable orientation and coordination of the magnetic field or of the magnetic fields keeps the charge carriers away e.g. from surfaces of the device in a targeted manner.

On account of the temperature-dictating statistical energy distribution of the charge carriers in the plasma, charge carriers may possibly have such a high velocity that they reach the device despite the magnetic field. However, even these charge carriers are at least decelerated by the inhomogeneous magnetic field before they reach the component to be protected, and cause correspondingly less damage there. The service life of the device is increased and the EUV lithography costs are lowered.

Preferably, the charge carriers of the plasma are mirrored at the inhomogeneous magnetic field, that is to say that their linear forward motion is reversed. The charge carriers are decelerated upon penetrating into regions of increasing magnetic field strength. As a result, they are moved back again to the site of the plasma and the duration for which the charge carriers stay in the region of the EUV plasma is increased. This increases the probability of collision between the electrons, the atoms and ions of the plasma and thus the transfer of energy of the electrons to the atoms and ions. The degree of ionization of the plasma, the recombination of the ions with the electrons and, as a result, the radiation power of the plasma is improved. If the charge carriers move into regions of decreasing magnetic field strength, then they are accelerated and removed from the critical region of the device along the magnetic field lines.

In this case, it is particularly advantageous if at least one magnetic field is localized and generated in such a way that the function of the device is shielded from effects of the magnetic means. This is done by means of a corresponding arrangement of the magnetic means (one or a plurality), e.g. alongside or behind the component(s).

Advantageous refinements of the device according to the invention have, as magnetic means, at least one permanent magnet, at least one coil, at least one coil with a pole shoe, and/or at least one electromagnet. A particularly strong magnetic field can be generated with this means. It is also advantageous if at least one magnetic means has a superconducting magnet.

In this case, it is advantageous if at least one magnetic means is arranged in and/or at an inlet means for a plasma-forming substance. Said inlet means is for example a nozzle. The configuration of the inlet means, depends inter alia on the state of matter of the target (gas, liquid or solid).

The inhomogeneous magnetic field may serve particularly efficiently for the protection of the device if at least one magnetic means is arranged concentrically with respect to the entry direction of the plasma-forming substance. In this case, by way of example, the inlet means of the device is protected if the device has an inlet means, and also, if appropriate, a mirror device fitted around the inlet means.

Preferably, provision is made of at least one magnetic means that is acentric with respect to the inlet means. This may alternatively or additionally be used as magnetic means in order to generate an inhomogeneous magnetic field or to amplify a magnetic field.

At least one mirror device advantageously serves for capturing the EUV radiation emitted by the plasma.

Preferably, the mirror device at least partly has a multilayer layer.

Preferred refinements of the radiation system provide for at least one magnetic means to be formed on that side of the mirror device that is remote from the plasma. As a result, the mirror function of the mirror device is not impaired by a material in the beam path.

Particularly preferably, a plurality of magnetic means formed on that side of the mirror device, which is remote from the plasma, is at least partly adapted to the form of the mirror device. By way of example, permanent magnets may be produced in such a way that they are adapted to the form of the mirror device.

The magnetic means that are adapted at least partly to the form of the mirror device are advantageously arranged at a small distance from the mirror device. Undesirable interactions between the mirror device and the magnetic means are thus minimized, such as, for example, the distortion of the mirror device by the weight force of the magnetic means.

For the advantageous generation of a suitable inhomogeneous magnetic field, the magnetic means that are adapted at least partly to the form of the mirror device all point with the same magnetic polarity toward the mirror device. This prevents the field lines of the magnetic means from short-circuiting in a confined space and particles from thereby being able to penetrate essentially without any deceleration into a region between two magnetic fields generated by adjacent magnetic means of different polarity.

A further advantageous refinement of the device according to the invention has a magnetic means having a control device for the generation of a temporally variable, in particular pulsed, magnetic field. The plasma can be constricted particularly efficiently by temporally and spatially variable magnetic fields.

One advantageous refinement of the device according to the invention has a laser means and/or a, for example electrical, discharge means for the generation of the plasma from a gaseous, solid or liquid target means, in particular xenon, lithium, gold and/or tin. An advantageous laser means is a pulsed Nd:YAG laser. In an advantageous manner, the plasma is formed in front of the exit opening of an inlet means, in particular in front of a nozzle.

BRIEF DESCRIPTION OF THE DRAWINGS

For a more complete understanding of the present invention, and the advantages thereof, reference is now made to the following descriptions taken in conjunction with the accompanying drawings, in which.

The following list of reference symbols can be used in conjunction with the figures:
1 Radiation system
3 Plasma
5 Mirror device
10 Magnetic means
11 Inhomogeneous magnetic field
12 Inlet means
15 Jet
I1 First positively charged ion
I2 Second positively charged ion

DETAILED DESCRIPTION OF ILLUSTRATIVE EMBODIMENTS

While not intending embodiments of the invention to be limited by any proposed theory of operation, several physical principles useful for describing the various embodiments are explained with reference to FIGS. 2a, 2b and 3.

Figure 3:
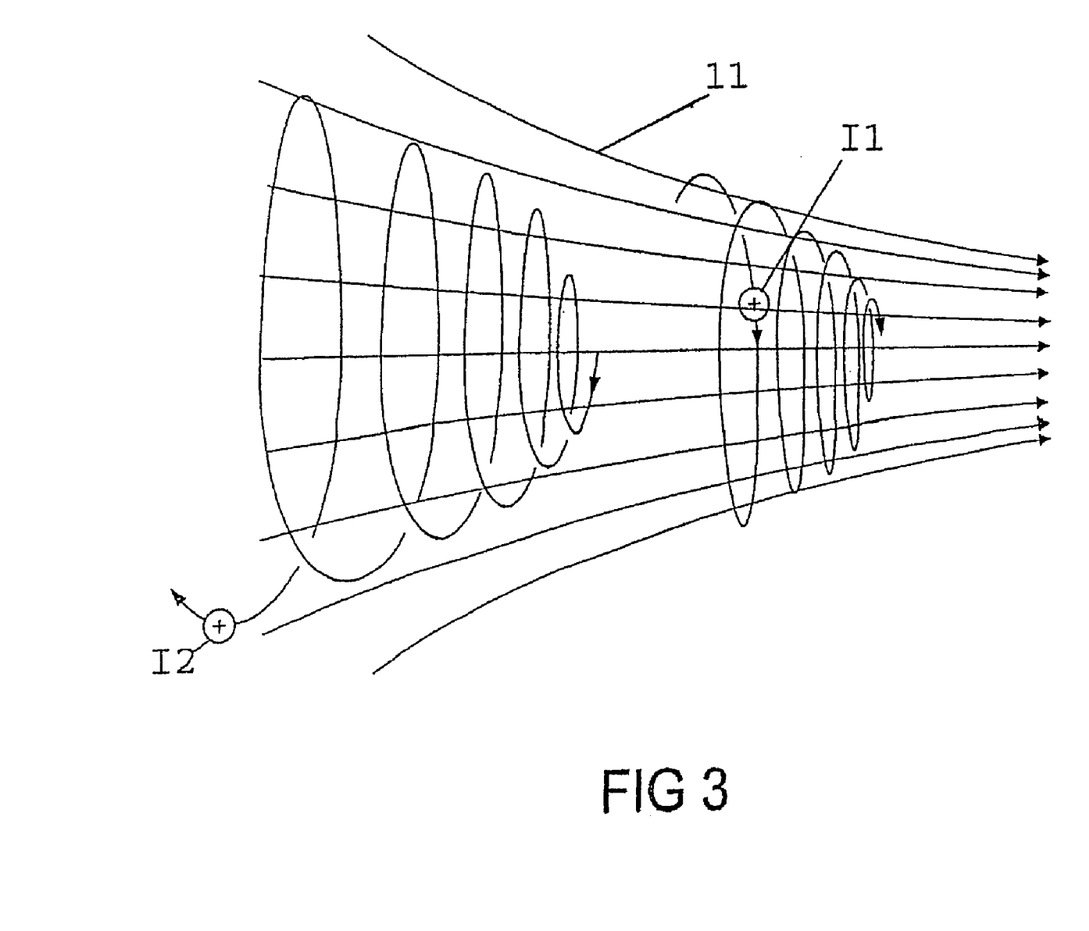
FIG. 3 shows a schematic illustration of positively charged ions in an inhomogeneous magnetic field.

FIG. 3 schematically illustrates a section through an approximate conical, static inhomogeneous magnetic field 11 formed circularly symmetrically about a center axis (not illustrated). The figure shows the known movement of a first positively charged ion I1 and a second positively charged ion I2.

The field lines of the magnetic field 11, which are illustrated by arrows, become compressed in the direction of the tapering of the cone, and the magnetic field strength increases in the direction of the tapering. The magnetic field accordingly has a gradient. The first positively charged ion I1 moves in a helical movement, which is illustrated by an arrow, in the direction of the strengthening of the magnetic field 11. The helical movement arises as a result of the superposition of a circular movement and a linear movement and is caused by the Lorentz force, $$K_L = qv_\perp B.$$

In this case $K_L$ designates the magnitude of the Lorentz force in the direction of the widening of the cone, q designates the charge of the ion, $v_\perp$ designates the velocity component of the ion which is perpendicular to the magnetic field, and B designates the magnetic induction at the location of the ion I1.

If the magnitude of the Lorentz force $K_L$ is equated with the magnitude of the centrifugal force, $$K_Z = mv_\perp^2/r,$$

(where m denotes the mass of the ion), then the radius r of the circular path results as $r = m/q \cdot v_\perp/B$. The superposition of this circular movement with the velocity component v parallel to the magnetic field B leads to a helical path around the magnetic field lines. The circulating ion has a magnetic moment, $$\mu = \tfrac{1}{2} \cdot mv_\perp^2/B,$$

which is an adiabatic invariant, i.e. is constant for sufficiently slowly variable magnetic fields.

If a particle such as the ion I1 in FIG. 3 moves into a region of greater field strength, then the perpendicular velocity $v_\perp$ and the perpendicular component of the kinetic energy, $$E_\perp = \tfrac{1}{2} mv_\perp,$$

increases, while owing to the conservation of energy, the forward movement along the field lines is retarded and the parallel component of the kinetic energy decreases. Since the kinetic energy is shifted such that the parallel velocity component is converted into a perpendicular velocity component by the magnetic field, the acting force is also called a mirror force, which in an axially symmetric magnetic field, is given by, $$K_Z^M = -\mu \frac{\partial B}{\partial z} = -1/2 \, (mv_\perp^2/B) \frac{\partial B}{\partial z}.$$

In this case, the z direction is the direction in which the magnetic field becomes strengthened. From the movement of the ion I1, the effect of the mirror force can be discerned from the fact that the height of the helical path decreases, the circular path itself becoming narrower.

The second positively charged ion I2 moves in the direction of decreasing field strength, the height of the helical paths and also the circular path radius increasing.

Given a sufficiently large gradient of the magnetic field and $v_\perp/v$ ratio, the parallel velocity component v of the ion becomes equal to zero and increases again with an opposite sign, that is to say that the particle is reflected and moved in the direction of smaller fields.

The mirror force acts equally on particles having positive and negative charge.

Figure 2A:
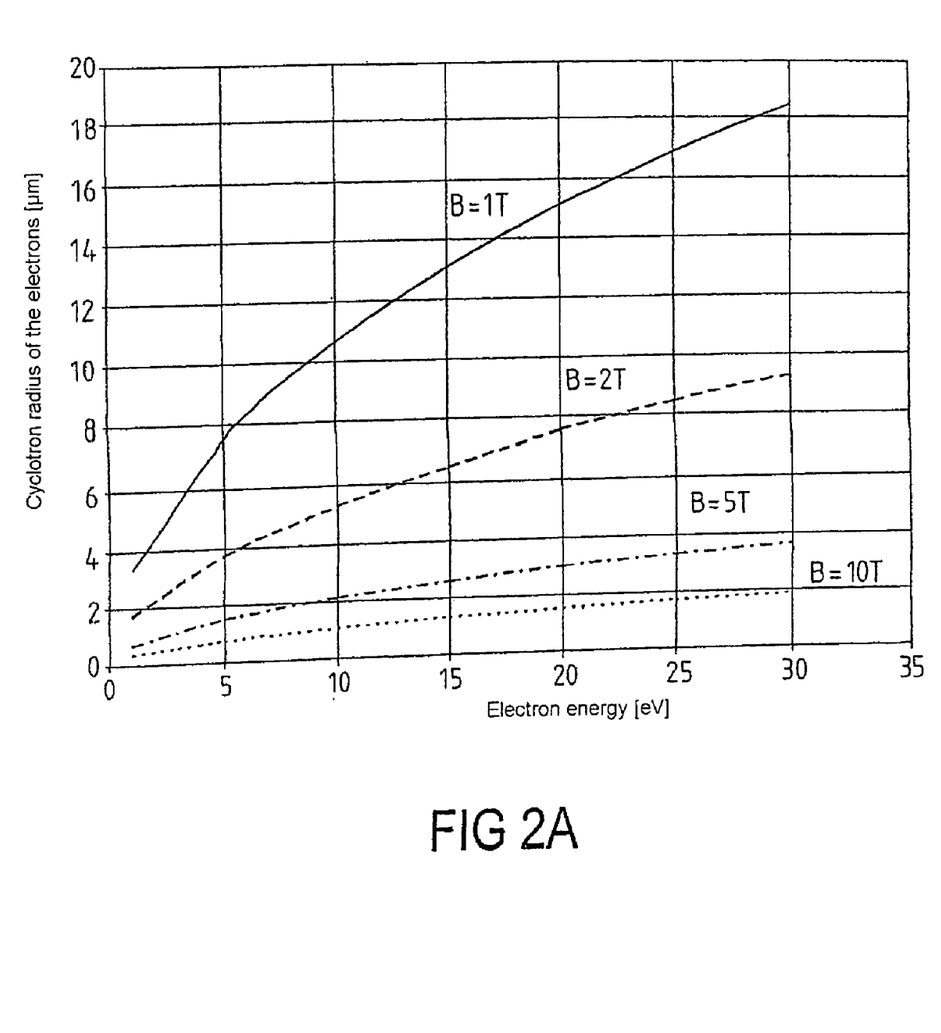
FIG. 2a shows, in a diagram, the dependence of the electron cyclotron radii on the electron energy and the magnetic induction.

FIG. 2a shows, in a diagram, the dependence of the electron cyclotron radius on the electron energy and the magnetic induction. In this case, the electron energy between 0 eV and 35 eV is plotted on the x-axis, and the electron cyclotron radius between 0 µm and 20 µm is plotted on the y-axis. A total of four profiles are illustrated, in dependence on the magnetic induction B. For a magnetic induction B of one Tesla, the radii are approximately 3 µm for approximately 1 eV and somewhat above 18 µm for 30 eV. As the magnetic induction rises, the radii become smaller; at 10 Tesla, the largest electron cyclotron radius calculated at an electron energy of 30 eV is less than 2 µm.

It can be gathered from the diagram of FIG. 2a that, at typical electron energy values in the plasma of 1-10 eV, a B field of 1 Tesla suffices to keep the electron radii at a maximum of approximately 10 µm. The radii are thus significantly smaller than the dimension of the plasma (approximately 1 mm) and the range of the magnetic fields. The consequence is a large number of circular movements of the electrons in the magnetic field. They are held in the magnetic field until they recombine with ions or leave the magnetic field along the field lines in the region of decreasing field strength.

A similar situation holds true for the positive ions, for example the xenon ions that are often used for EUV radiation. The magnetic effect is more weakly pronounced here, which is manifested in larger cyclotron radii.

Figure 2B:
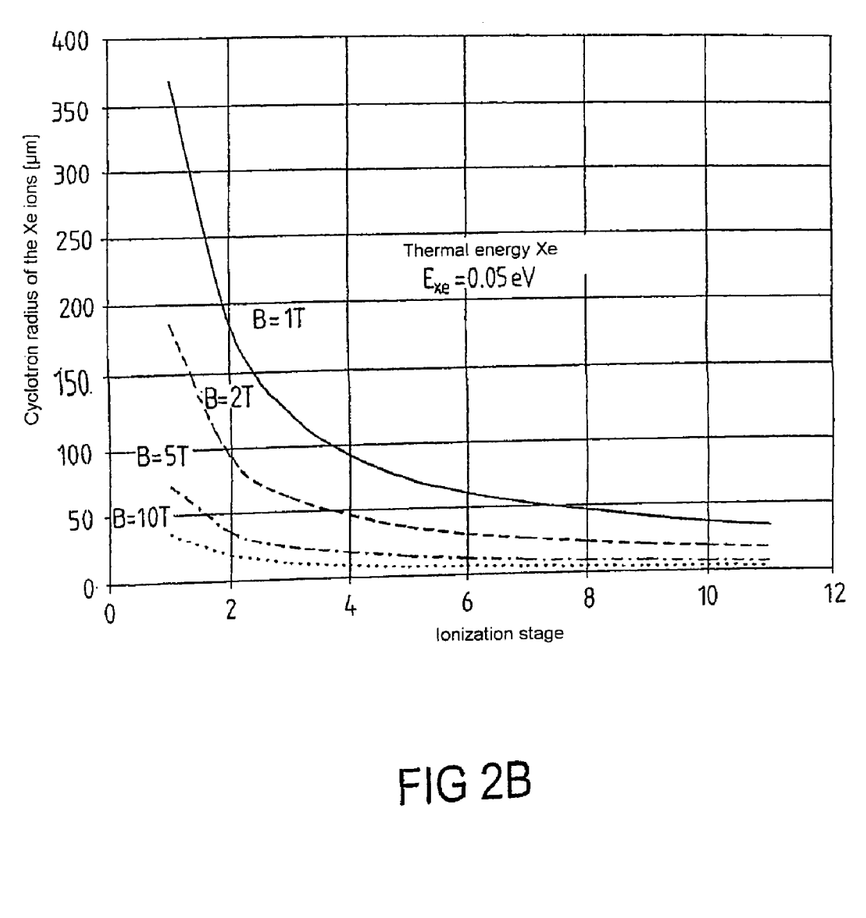
FIG. 2b shows, in a diagram, the dependence of the xenon ion cyclotron radii on the ionization state of the xenon ions and the magnetic induction.

FIG. 2b shows, in a diagram, the dependence of the xenon and cyclotron radii on the ionization stage of the xenon ions and the magnetic induction. The ionization stage between 0 and 12 is plotted on the x axis, and the xenon ion cyclotron radii between 0 µm and 400 µm are plotted on the y axis. In this case, the calculations were carried out for cold xenon ions having an energy of 0.05 eV, which corresponds to a temperature of approximately 580 K.

In this case, too, the radii are greatest for a magnetic induction of 1 Tesla and lie between 370 µm and 40 µm, depending on the ionization stage. In this case, the radii are smaller, the higher the ionization stage. At stronger magnetic fields such as, for instance, at 10 Tesla, the radii are smaller than 40 µm. These cold xenon ions are likewise held in the plasma. In the case of hot xenon ions (having energies of 30 eV, corresponding to a temperature of $3.50 \times 10^5$ K), the radii lie in the millimeters range. For this reason, although these xenon ions leave the plasma, they are deflected, decelerated or even reflected by the magnetic fields over the entire distance between plasma and component to be protected, so that their damaging effect is reduced. The distances between plasma and collector mirror usually lie in the decimeters range.

Figure 1:
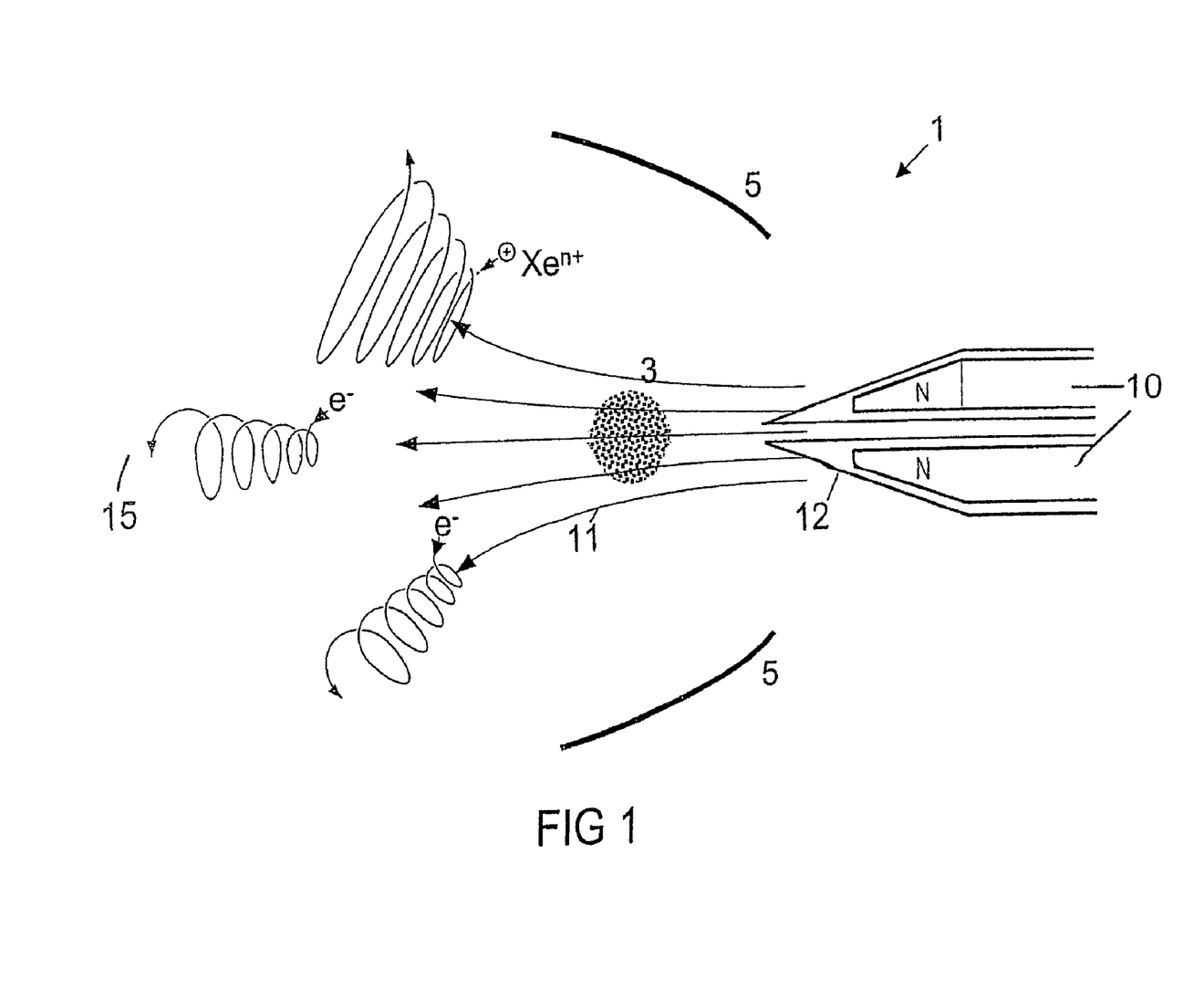
FIG. 1 shows a schematic illustration of a device having a magnetic means arranged concentrically around an inlet means.

FIG. 1 shows a schematic illustration of an embodiment of the device according to the invention. The device in this case is a radiation system 1, which in this case has a radiation source and associated components, such as a mirror device for focusing the radiation. Situated in the center is the plasma 3, which is based on xenon, for example, which is fed as a jet via an inlet means 12 (here configured as exit nozzle) and, as in the case of an LPP source, for example, is excited by a pulsed laser beam.

The exit nozzle 12 is surrounded concentrically by a ferromagnetic permanent magnet 10 as magnetic means, which generates an inhomogeneous magnetic field 11 illustrated by magnetic field lines. In this case, the magnetic north pole of the permanent magnet points in the direction of the plasma; however, this could equally well be the magnetic south pole. The magnetic field 11 is strongest at the location of the exit nozzle 12 and becomes weaker along the jet direction of the jet 15 admitted through the exit nozzle 12. In particular, the magnetic field lines of the magnetic field 11 also run through the plasma 3.

An essentially hemispherical or parabolic collector mirror 5 is fitted as mirror device concentrically around the exit nozzle 12. The collector mirror 5 is preferably a multilayer mirror and serves for concentrating the EUV radiation emitted by the plasma 3.

A xenon ion designated as $Xe^{n+}$ moves on a helical path, which is illustrated by an arrow, around a magnetic field line away from the plasma 3 in a direction in which it can no longer come into contact with the collector mirror 5.

Two electrons designated by $e^-$ likewise move in ever enlarging helical paths around a respective field line away from the plasma, to the side opposite to the exit nozzle 12 and in the direction of decreasing magnetic field strength.

The mirror force acts on electrons as well as on ions in the same direction and is independent of the sign of the charge.

In another configurational form, the radiation system additionally or alternatively also has, in acentric fashion, one or more magnetic means which generate an inhomogeneous magnetic field. The shielding effect can be reinforced by these magnetic means.

Another configurational form (not illustrated) comprises an inlet means such as the inlet nozzle 12 with magnetic means without a mirror device.

Figure 4:
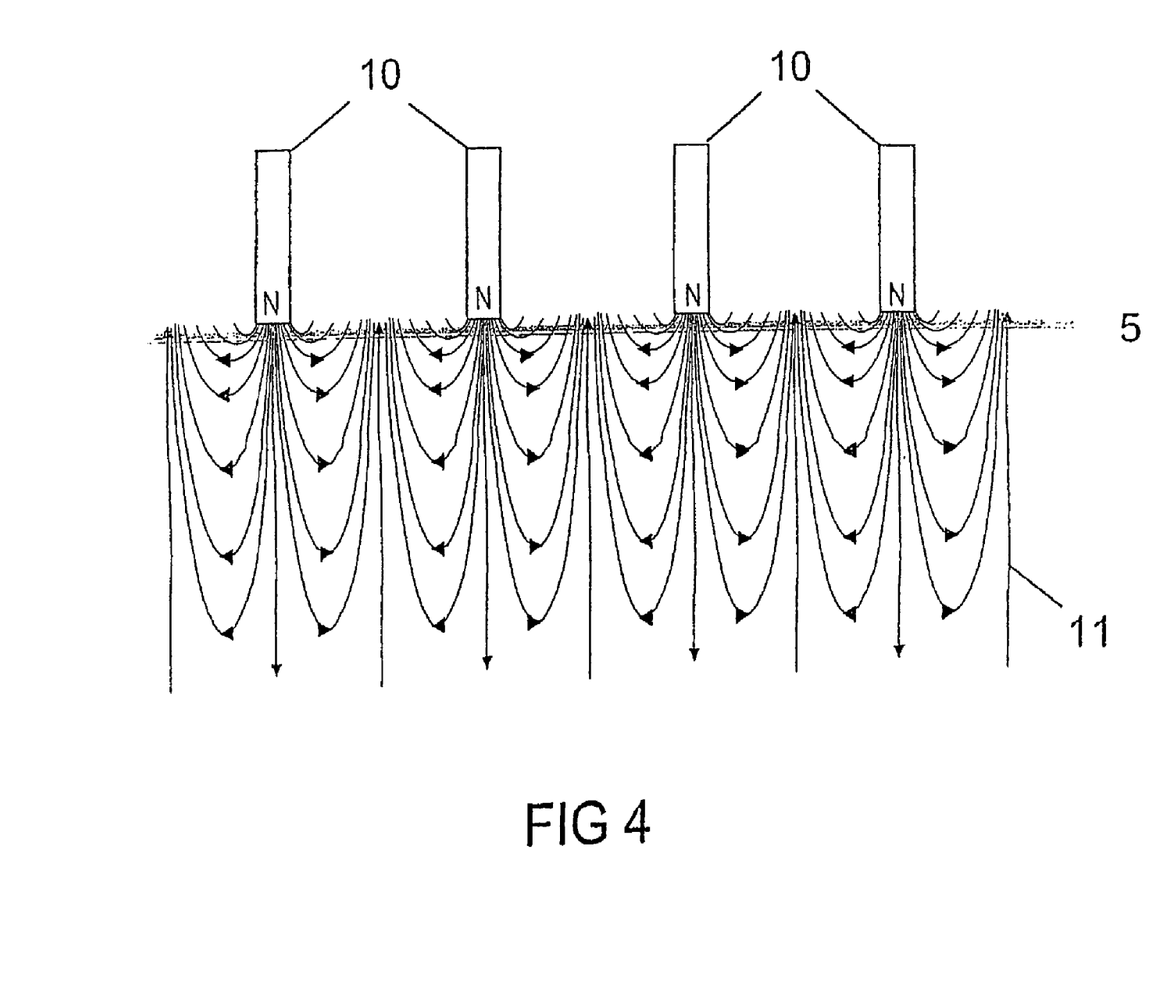
FIG. 4 shows a schematically illustrated arrangement of magnetic means on the rear side of a mirror device, here illustrated as a planar multilayer mirror, as a device for influencing EUV radiation.

FIG. 4 shows a schematically illustrated arrangement of ferromagnets 10 as magnetic means on the rear side of a mirror device, here illustrated as a planar multilayer mirror 5, as a device according to the invention for influencing EUV radiation.

The multilayer mirror 5 is illustrated in planar fashion in FIG. 4, although it actually has a concave, in particular spherical or parabolic form, as in FIG. 1. Some ferromagnets 10 are arranged on that side of the multilayer mirror 5 which is remote from the plasma, in such a way that they all point with the same polarity (here with the magnetic north pole) in the direction of the multilayer mirror 5 and generate an inhomogeneous magnetic field 11 on that side of the multilayer mirror 5 which faces the plasma (not illustrated here).

The magnetic field lines are illustrated as arrows in the drawing. The magnetic field 11 is strongest at the locations opposite to the ferromagnets, on that side of the multilayer mirror which faces the plasma, at the locations at which the magnetic field lines lie closest together and decreases in the direction of the plasma. Therefore, the result is, as in FIG. 1, a reflective effect of the inhomogeneous magnetic field 11 on charge carriers of the plasma.

The parallel orientation of the ferromagnets 10 prevents the field lines between the ferromagnets from closing over a short distance and regions having small field gradients, which exert only small mirror forces on charged particles, from thereby arising there.

The ferromagnets 10 in this case have a cylindrical form and are arranged at a small distance from the multilayer mirror 5. In this case, they are configured such that they are adapted to its external form. A direct contact between the ferromagnets 10 and the multilayer mirror 5 is not present, in order to avoid distortions as a result of their weight force and the magnetic forces between the ferromagnets. The multilayer mirror 5 likewise does not contain any ferromagnetic constituents, in order that no interaction arises between the ferromagnets 10 and the multilayer mirror 5. Although there is no mechanical contact, the distance is kept as small as possible in order that the magnetic field 11 in front of the multilayer mirror 5 is as strong as possible.

In another embodiment (not illustrated), the device has, as in FIG. 1, a radiation source, an inlet nozzle and a mirror device, the ferromagnets from FIG. 4 being fitted in addition or as an alternative to the magnetic means of FIG. 1.

Figure 5A:
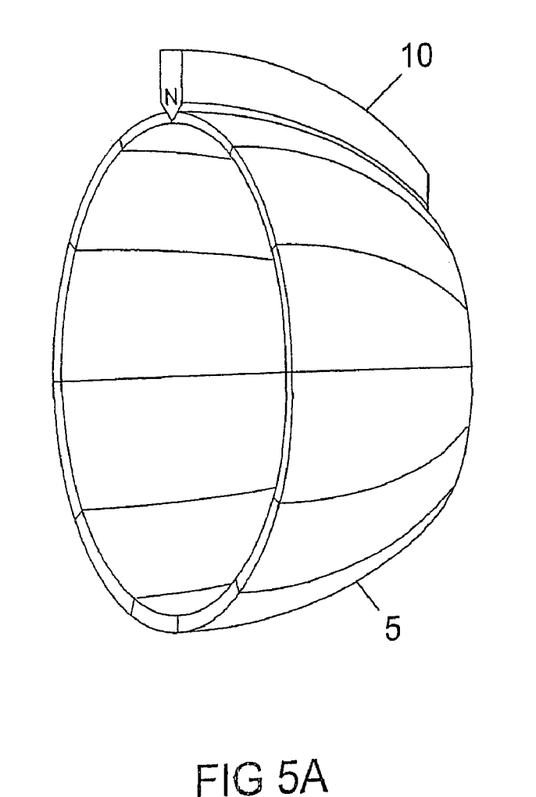
FIG. 5a shows a schematic illustration of a mirror device, composed of segments, as a device having magnetic means adapted to the form of the mirror device, in a perspective view.
Figure 5B:
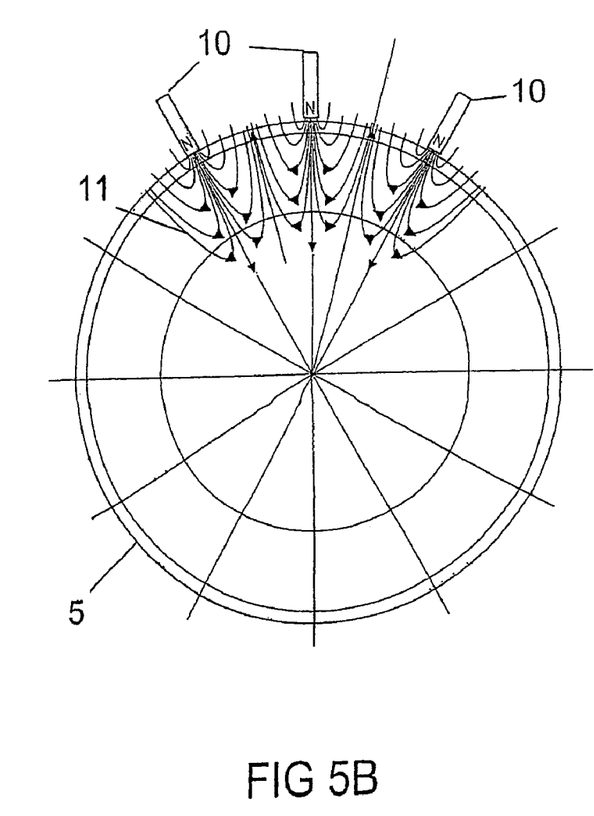
FIG. 5b shows a schematic illustration of the mirror device of FIG. 5a in an axial plan view.

FIGS. 5a and 5b show a schematic illustration of a collector mirror 5, composed of segments, as a device with ferromagnets 10 as magnetic means in a perspective view and in an axial plan view, respectively. The collector mirror 5 illustrated here is composed of a plurality of segments that are mounted separately and in each case at narrow distances from one another. Overall, the collector mirror 5 is again formed approximately in semicircular fashion. FIG. 5a illustrates only one ferromagnet 10, in order to show the basic arrangement. In an actual configuration, by way of example, each segment of the collector mirror 5 may be provided with a ferromagnet, or, alternatively, independently of the collector mirrors 5, a plurality of ferromagnets 10 may be fitted on that side of the collector mirror 5 that faces away from the plasma.

FIG. 5b additionally also illustrates the profile of the field lines of the inhomogeneous magnetic field 11 by means of arrows. All of the ferromagnets 10 are once again polarized in a parallel fashion. The form of the field lines corresponds to that from FIG. 4, but here the collector mirror 5 is illustrated in its correct form and the magnetic field 11 is correspondingly deformed.

The ferromagnets 10 are arranged as close as possible to the collector mirror 5 without touching it. The resulting inhomogeneous magnetic field 11, which is stronger in the vicinity of the collector mirror 5 than in the direction of the plasma (not illustrated), mirrors positive and negative charge carriers and thereby protects the multilayer mirror 5.

An as far as possible pointed configuration of the poles of the ferromagnets 10 results in large magnetic field gradients and mirror forces.

What is claimed is:

1. A device for generating and/or influencing electromagnetic radiation from a plasma for the lithographic fabrication of semiconductor components, the device comprising:
   a radiation system which comprises a radiation source containing the plasma for emitting electromagnetic radiation, the radiation system comprising at least one associated component for at least one of generating or influencing the emitted electromagnetic radiation; and
   a magnetic field generator that generates at least one inhomogeneous magnetic field for the shielding of at least one component of the device from charge carriers of the plasma, the magnetic field generator being arranged on the component of the device and the gradient of the inhomogeneous magnetic field pointing essentially from the plasma to the component.

2. The device as claimed in claim 1, wherein the charge carriers of the plasma are mirrored at the inhomogeneous magnetic field.

3. The device as claimed in claim 1, wherein the magnetic field lines of the magnetic field are oriented such that they essentially point from the component toward the plasma.

4. The device as claimed in claim 1, wherein at least one magnetic field is localized and generated in such a way that the function of the device is shielded from effects of the magnetic field generator.

5. The device as claimed in claim 1, wherein the magnetic field generator has at least one magnet, the at least one magnet comprising a permanent magnet, at least one coil, at least one coil with a pole shoe, and/or at least one electromagnet.

6. The device as claimed in claim 5, wherein the at least one magnetic means comprises a superconducting magnet.

7. The device as claimed in claim 5, wherein the at least one magnet is arranged in and/or at an inlet for a plasma-forming substance.

8. The device as claimed in claim 7, wherein the at least one magnet is arranged concentrically with respect to the entry direction of the plasma-forming substance.

9. The device as claimed in claim 1, further comprising:
an inlet for a plasma-forming substance; and
at least one magnet that is acentric with respect to the inlet.

10. The device as claimed in claim 1, further comprising at least one mirror device for capturing EUV radiation emitted by the plasma.

11. The device as claimed in claim 10, wherein the mirror device at least partly has a multilayer layer.

12. The device as claimed in claim 10, wherein at least one magnetic device is formed on a side of the mirror device that is remote from the plasma.

13. The device as claimed in claim 12, wherein a plurality of magnets are formed on that side of the mirror device that is remote from the plasma, the magnets being adapted at least partly to the form of the mirror device.

14. The device as claimed in claim 13, wherein the magnets that are adapted at least partly to the form of the mirror device are arranged at a small distance from the mirror device.

15. The device as claimed in claim 13, wherein the magnets that are adapted at least partly to the form of the mirror device all point with the same magnetic polarity toward the mirror device.

16. The device as claimed in claim 1, further comprising a magnetic device that has a control device for the generation of a temporally variable inhomogeneous magnetic field.

17. The device as claimed in claim 1, further comprising a discharge device to generate the plasma.

18. The device as claimed in claim 17, wherein the discharge device comprises a pulsed Nd:YAG laser.

19. The device as claimed in claim 1, wherein the plasma is formed in front of an exit opening of an inlet means.

20. An apparatus for lithographic fabrication of semiconductor components, the apparatus comprising:
a radiation source containing a plasma for emitting electromagnetic radiation, a radiation system comprising at least one associated component for at least one of generating or influencing the emitted electromagnetic radiation; and
a magnetic field generator encircling said radiation source, wherein the magnetic field generator is arranged on the at least one component and provides an inhomogeneous magnetic field for the shielding of at least one component of the device from charge carriers of the plasma.

* * * * *